(12) United States Patent
Lan et al.

(10) Patent No.: US 11,605,620 B2
(45) Date of Patent: Mar. 14, 2023

(54) THREE-DIMENSIONAL (3D) INTEGRATED CIRCUIT WITH PASSIVE ELEMENTS FORMED BY HYBRID BONDING

(71) Applicant: QUALCOMM Incorporated, San Diego, CA (US)

(72) Inventors: Je-Hsiung Lan, San Diego, CA (US); Ranadeep Dutta, Del Mar, CA (US); Jonghae Kim, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 93 days.

(21) Appl. No.: 16/906,509

(22) Filed: Jun. 19, 2020

(65) Prior Publication Data

US 2021/0398957 A1   Dec. 23, 2021

(51) Int. Cl.
| | |
|---|---|
| *H01L 25/16* | (2006.01) |
| *H01L 23/00* | (2006.01) |
| *H01L 49/02* | (2006.01) |
| *H01L 27/092* | (2006.01) |
| *H03H 9/17* | (2006.01) |

(52) U.S. Cl.
CPC ............ *H01L 25/162* (2013.01); *H01L 24/05* (2013.01); *H01L 24/08* (2013.01); *H01L 24/80* (2013.01); *H01L 27/092* (2013.01); *H01L 28/10* (2013.01); *H01L 28/40* (2013.01); *H03H 9/17* (2013.01); *H01L 2224/05647* (2013.01); *H01L 2224/08145* (2013.01); *H01L 2224/80895* (2013.01); *H01L 2224/80896* (2013.01)

(58) Field of Classification Search
None
See application file for complete search history.

(56) References Cited

U.S. PATENT DOCUMENTS

| | | | |
|---|---|---|---|
| 10,541,228 B2* | 1/2020 | Chen | H01L 23/367 |
| 11,336,251 B2* | 5/2022 | Lan | H03H 3/00 |
| 2015/0200049 A1* | 7/2015 | Kim | H01F 27/2804 |
| | | | 336/200 |

(Continued)

FOREIGN PATENT DOCUMENTS

| | | | | |
|---|---|---|---|---|
| CN | 109088612 A | * | 12/2018 | |
| CN | 110729277 A | * | 1/2020 | ....... H01L 23/53228 |

(Continued)

*Primary Examiner* — Telly D Green
(74) *Attorney, Agent, or Firm* — Patterson + Sheridan, L.L.P.

(57) ABSTRACT

A three-dimensional integrated circuit (3DIC) and techniques for fabricating a 3DIC. An example semiconductor device generally includes an integrated circuit (IC) having a first plurality of pads coupled to components of the IC, wherein a first oxide material is disposed between the first plurality of pads, and a second plurality of pads, wherein at least a portion of the first plurality of pads is bonded to at least a portion of the second plurality of pads, and wherein a second oxide material is disposed between the second plurality of pads and is bonded to the first oxide material b. The semiconductor device may also include a substrate disposed above the second plurality of pads, one or more passive devices adjacent to the substrate, and one or more vias formed through the substrate, wherein at least one of the second plurality of pads is coupled to the one or more vias.

20 Claims, 3 Drawing Sheets

(56) References Cited

U.S. PATENT DOCUMENTS

| | | | |
|---|---|---|---|
| 2015/0201495 A1* | 7/2015 | Kim | H01F 17/0006 |
| | | | 174/255 |
| 2016/0233292 A1* | 8/2016 | Chen | H01L 28/10 |
| 2017/0141756 A1* | 5/2017 | Yun | H03H 9/0561 |
| 2018/0012868 A1* | 1/2018 | Huang | H01L 24/80 |
| 2018/0278236 A1* | 9/2018 | Hurwitz | H03H 9/568 |
| 2018/0366437 A1* | 12/2018 | Chen | H01L 23/467 |
| 2019/0273116 A1* | 9/2019 | Goktepeli | H01L 27/20 |
| 2020/0020635 A1* | 1/2020 | Chang | H01L 24/80 |
| 2020/0168574 A1* | 5/2020 | Huang | H01L 24/10 |
| 2021/0099149 A1* | 4/2021 | Lan | H03H 7/1741 |
| 2021/0100103 A1* | 4/2021 | Chung | H05K 1/115 |
| 2021/0183794 A1* | 6/2021 | Tang | H01L 25/16 |
| 2021/0327873 A1* | 10/2021 | Lan | H03H 9/1014 |

FOREIGN PATENT DOCUMENTS

| | | | | |
|---|---|---|---|---|
| EP | 2779236 A2 * | 9/2014 | | H01F 17/0006 |
| JP | 2015513820 A * | 7/2015 | | |
| KR | 20170046557 A * | 5/2017 | | H01L 24/25 |

\* cited by examiner

THREE-DIMENSIONAL (3D) INTEGRATED CIRCUIT WITH PASSIVE ELEMENTS FORMED BY HYBRID BONDING

FIELD OF THE DISCLOSURE

The present disclosure generally relates to semiconductor devices and, more particularly, to a three-dimensional integrated circuit (3DIC).

DESCRIPTION OF RELATED ART

A wireless device (e.g., a cellular phone or a smartphone) in a wireless communication system may include a radio frequency (RF) transceiver to transmit and receive data for two-way communication. A mobile RF transceiver may include a transmit section for data transmission and a receive section for data reception. For data transmission, the transmit section may modulate an RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna and may amplify and process the received RF signal to recover data sent by the base station. One or more filters may be implemented in the transmit path and the receive path of the wireless device.

Complementary metal-oxide-semiconductor (CMOS) devices are fundamental components for integrated circuits to implement digital logic. A CMOS device typically includes a p-type metal-oxide-semiconductor (PMOS) transistor used to pull an output up to logic high and an n-type metal-oxide-semiconductor (NMOS) transistor used to pull the output down to logic low, depending on an input signal provided to the gates of the PMOS and NMOS transistors. While CMOS devices may be used for digital signal processing, other integrated circuits (ICs) may be used to serve various functions such as signal amplification and filtering for wireless communication.

SUMMARY

Certain aspects provide a three-dimensional integrated circuit (3DIC) and techniques for fabricating a 3DIC.

Certain aspects provide a semiconductor device. The semiconductor device generally includes an integrated circuit (IC) having a first plurality of pads coupled to components of the IC, wherein a first oxide material is disposed between the first plurality of pads, and a second plurality of pads, wherein at least a portion of the first plurality of pads is bonded to at least a portion of the second plurality of pads, and wherein a second oxide material is disposed between the second plurality of pads, the first oxide material being bonded to the second oxide material. The semiconductor device may also include a substrate disposed above the second plurality of pads, one or more passive devices disposed adjacent to the substrate, and one or more vias formed through the substrate, wherein at least one of the second plurality of pads is coupled to the one or more vias.

Certain aspects provide a method for fabricating a semiconductor device. The method generally includes forming an IC having a first plurality of pads coupled to components of the IC, wherein a first oxide material is disposed between the first plurality of pads; forming one or more vias through a substrate; forming a second plurality of pads, wherein at least one of the second plurality of pads is coupled to the one or more vias and wherein a second oxide material is disposed between the second plurality of pads; forming one or more passive devices adjacent to the substrate; bonding at least a portion of the first plurality of pads to at least a portion of the second plurality of pads; and bonding the first oxide material to the second oxide material.

Other aspects, advantages, and features of the present disclosure will become apparent after review of the entire application, including the following sections: Brief Description of the Drawings, Detailed Description, and the Claims.

DETAILED DESCRIPTION

Figure 1:
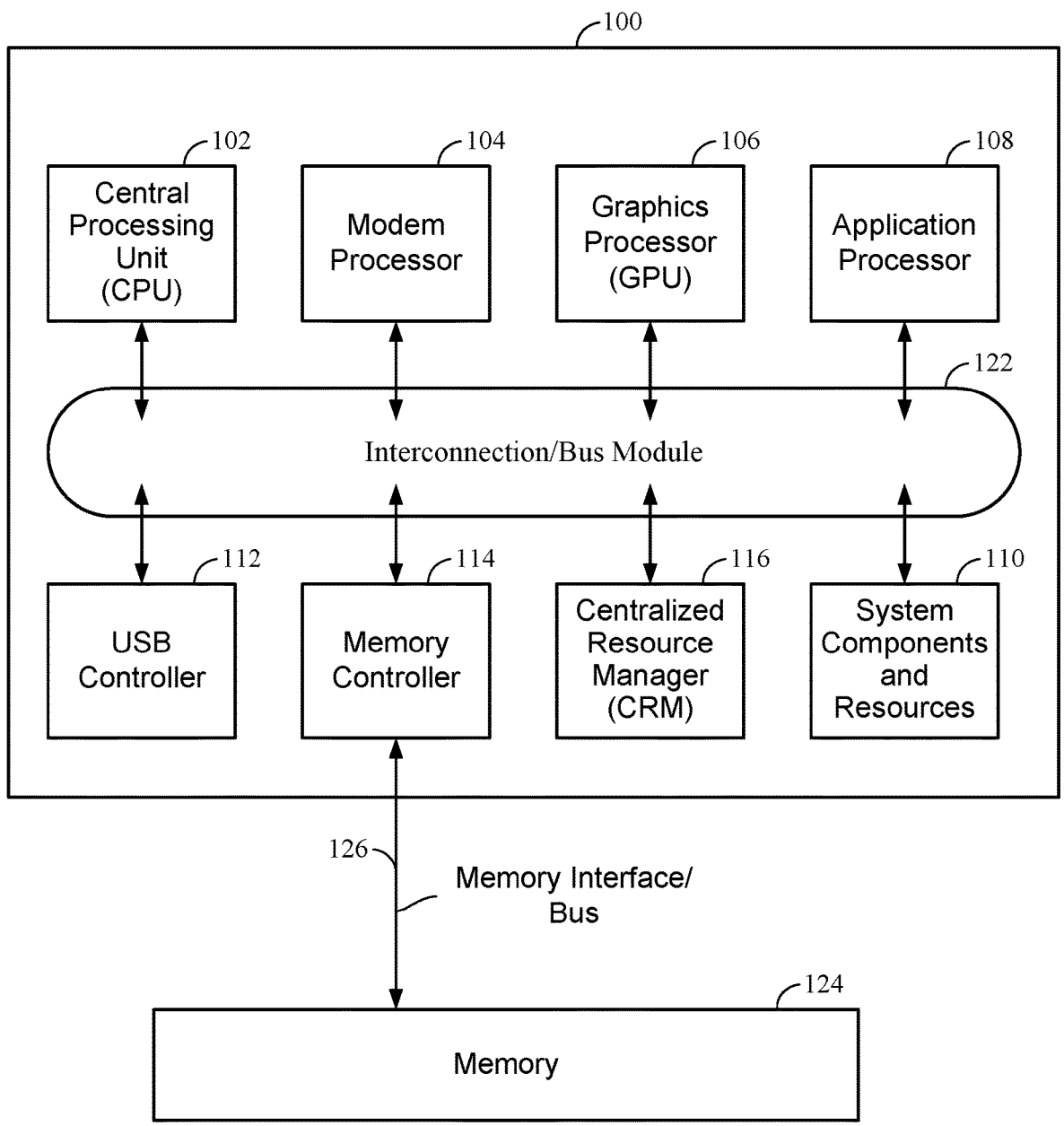
FIG. 1 illustrates an example implementation of a system-on-a-chip (SOC).

Certain aspects of the present disclosure provide a three-dimensional (3D) passive on alumina (PoA) device, implemented using through-alumina vias (TAVs). The PoA device may be hybrid bonded to a complementary metal-oxide-semiconductor (CMOS) integrated circuit (IC) for application to fifth-generation (5G) system-on-chip (SoC) technologies with broadband integrated passive devices (IPDs) and narrow-band acoustic filters. High performance IPDs may be fabricated on a substrate (e.g., a thin alumina ceramic substrate) with two-dimensional (2D) metal-insulator-metal (MIM) capacitors, 2D spiral inductors, and/or three-dimensional (3D) solenoid inductors, as described in more detail herein. The IPDs may be heterogeneously stacked (e.g., using die-to-wafer (D2 W) or wafer-to-wafer (W2 W) stacking) onto a silicon (Si)-CMOS IC by copper (Cu)-to-Cu and oxide-to-oxide hybrid bonding technology, as described herein.

Certain aspects provide a three-dimensional integrated circuit (3DIC) implemented with a thin substrate having a lower loss tangent and higher thermal conductivity, as compared to conventional implementations. IPDs, such as MIM capacitors and spiral inductors, may be implemented with high conductivity metallization and low-loss-tangent dielectrics. In certain aspects, the 3D solenoid inductors may be formed by through-substrate vias (e.g., TAVs) on the 3DIC. Broadband IPDs and narrowband acoustic filters may be integrated on the CMOS IC to implement a high performance RF 3DIC.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., ROM, RAM, flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

FIG. 1 illustrates example components and interconnections in a system-on-chip (SoC) 100 suitable for implementing various aspects of the present disclosure. The SoC 100 may include a number of heterogeneous processors, such as a central processing unit (CPU) 102, a modem processor 104, a graphics processor 106, and an application processor 108. In certain aspects, the modem processor 104 may be implemented using a three-dimensional (3D) integrated circuit (IC), as described in more detail herein. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture (e.g., CoreConnect, AMBA, etc.). Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously.

The memory controller 114 may be a specialized hardware module configured to manage the flow of data to and from a memory 124 via a memory interface/bus 126.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

EXAMPLE THREE-DIMENSIONAL (3D) INTEGRATED CIRCUIT WITH PASSIVE ELEMENTS

In the current fifth-generation (5G) and coming sixth-generation (6G) eras, wireless communications though an air interface over 10 gigabits per second (Gb/s) speed with low latency for various applications is becoming more and more important. These applications may include autonomous driving, industry internet of things (IoT), remote medical operations/resources sharing, infotainment, gaming, education, and interactive-collaborations with artificial intelligence (AI), virtual reality (VR), augmented reality (AR), mixed reality (MR), and extended reality (XR) devices. Massive data transmission with live high-definition (HD) video and high fidelity voice over internet protocol (VoIP) audio content transmission for MR and XR involve both downlink and uplink speeds much higher than 10 Gbps, which may be realized with millimeter wave (mmWave) communications that offer wide bandwidth.

Accordingly, wideband filters are important for 5G radio frequency (RF) front-end (RFFE) implementations to offer high speed communications. Among the available RF filter technologies are integrated passive devices (IPDs), such as metal-insulator-metal (MIM) capacitors (also referred to as "capacitive elements") and inductors (also referred to as "inductive elements"), which may be implemented with process advancements to achieve high quality factor (HQ) inductor (L) and capacitor (C) devices.

HQ IPDs are desirable for high performance RFFE circuitry to implement matching components, as well as LC filters that benefit greatly from low insertion loss, especially for 5G wideband filter applications. Certain aspects of the present disclosure are directed to a three-dimensional (3D) integrated circuit (3DIC) (also referred to herein as a "semiconductor device") implemented with an alumina ceramic substrate, facilitating formation of IPDs such as 2D or 3D inductors. Although improved performance may be achieved for 2D IPD filters implemented on an alumina ceramic substrate, a compact filter design is desirable for mobile user-equipment (UE) devices, which may be obtained by forming a 3D solenoid inductor with through-substrate vias, as described in more detail herein.

In certain aspects, the 3DIC may be implemented with hybrid copper (Cu)-to-Cu and oxide-to-oxide bonding (hereinafter referred to as "Cu-oxide bonding") technology. For example, a die-to-wafer (D2 W) or wafer-to-wafer (W2 W) stacking method may be used to achieve hybrid bonding of a complementary metal-oxide-semiconductor (CMOS) IC to an IC package with the through-substrate vias as described herein.

Figure 2:
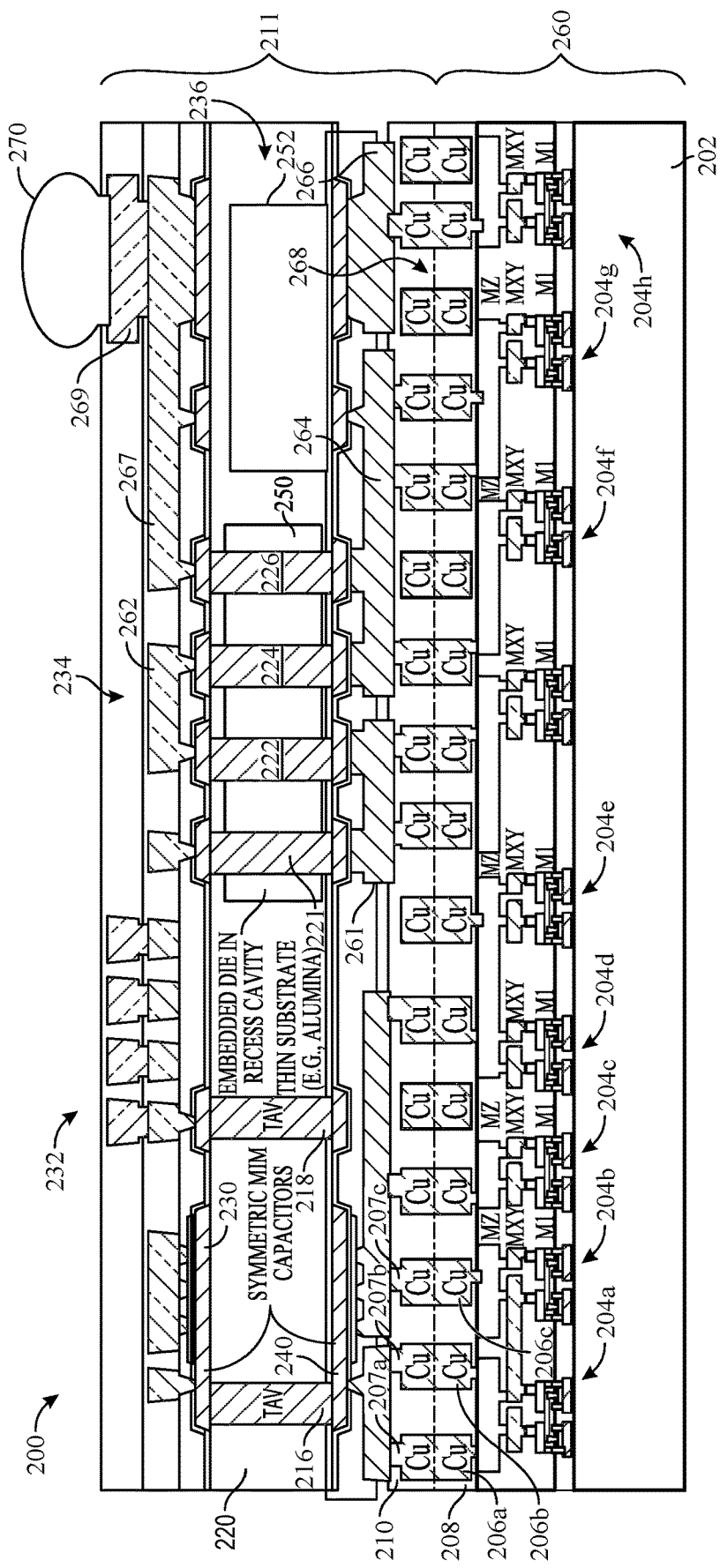
FIG. 2 illustrates a three-dimensional integrated circuit (3DIC) implemented with hybrid copper (Cu)-to-Cu and oxide-to-oxide bonding technology, in accordance with certain aspects of the present disclosure.

FIG. 2 illustrates a 3DIC 200 implemented with hybrid Cu-to-oxide bonding technology, in accordance with certain aspects of the present disclosure. As illustrated, the 3DIC 200 includes a CMOS substrate 202 on which CMOS transistors 204*a*, 204*b*, 204*c*, 204*d*, 204*e*, 204*f*, 204*g*, 204*h* (collectively referred to herein as "CMOS transistors 204") may be formed. Each of the CMOS transistors is coupled to one or more copper (Cu) pads through various layers of a CMOS IC 260. For example, the Cu pads 206*a*, 206*b*, 206*c* may be coupled to CMOS transistors 204*a*, 204*b*, as illustrated in FIG. 2. The Cu pads may be formed using a copper damascene process, for example.

Cu pads may be embedded in oxide material that has gone through a chemical-mechanical polishing (CMP) process. For example, oxide 208 may be formed between the Cu pads of the CMOS IC 260, followed by a CMP process of the oxide. Hybrid Cu-to-Cu and oxide-to-oxide bonding may be used to bond Cu pads (e.g., Cu pads 206*a*, 206*b*, 206*c*, collectively referred to herein as "Cu pads 206") of the CMOS IC 260 to Cu pads (e.g., Cu pads 207*a*, 207*b*, 207*c*, collectively referred to herein as "Cu pads 207") of an IC package 211. Hybrid Cu—Cu and Oxide-oxide bonding may be performed by first forming the oxide-to-oxide bond at room temperature. Then the wafer is exposed to temperatures of 150-300 Celsius in order for the Cu-to-Cu compression bond to form, allowing metal to metal interconnect for the top tier wafer (or die) (e.g., IC package 211) to the bottom wafer (e.g., CMOS IC 260).

The IC package 211 may include various passive devices implemented on a substrate 220. In certain aspects, the substrate 220 may be a ceramic alumina substrate, as described herein. Oxide 208 of the CMOS IC 260 may be bonded to the oxide 210 of the IC package 211 during the hybrid bonding process. The oxide 210 may be formed between the Cu pads (e.g., Cu pads 207*b*, 207*c*) coupled to passive devices of the IC package 211 using an oxide deposition process (e.g., chemical vapor deposition (CVD)). The passive devices may include a MIM capacitive element 230, 2D inductive element 232, 3D inductive element 234, and/or resonator 236.

Vias 216, 218, 221, 222, 224, 226 may be formed through the substrate 220. For example, via 216 may be coupled between the MIM capacitive element 230 and one or more Cu pads, such as Cu pad 207*a*, as illustrated. In some cases, the MIM capacitive element 230 may be implemented above the via 216, and another MIM capacitive element 240 may be implemented below the via 216, forming symmetric MIM capacitive elements, as illustrated.

In some aspects, one or more dies may be implemented in cavities formed in substrate 220. For example, a die 250 may be embedded in a recess cavity of the substrate 220. In some cases, the die 250 may be implemented as a magnetic core for the 3D inductive element 234. The 3D solenoid inductive element may be formed by through-substrate vias 221, 222, 224, 226. For example, via 221 may be connected to via 222 by interconnect 261, via 222 may be connected to via 224 by interconnect 262, and via 224 may be connected to via 226 by interconnect 264. As illustrated, the magnetic core may be implemented adjacent to vias 221, 222, 224, 226, forming the 3D inductive element 234, to increase the inductance value of the higher permeability magnetic core.

In some cases, a resonator 252 (e.g., film bulk acoustic resonator (FBAR)) may be implemented in a cavity formed in the substrate 220, as illustrated. A terminal of the resonator 252 may be coupled to the 3D inductive element 234 by interconnect 264, and another terminal of the resonator 252 may be coupled to the CMOS transistors 204*h* by interconnect 266 and through hybrid-bonded Cu pads 268. As illustrated, interconnects 267, 269 (e.g., an under bump metallization (UBM)) and solder ball 270 may be used to facilitate electrical connectivity to the 3D inductive element 234.

Certain aspects of the present disclosure provide reduced power consumption with implementation of high performance 2D and 3D HQ IPDs for 5G wideband LC filters, as well as performance improvements such as electrical and thermal performance benefits achieved from HQ integrated passives used for LC matching and filter components. Certain aspects also provide area reduction as compared to conventional implementations by using a compact 3DIC which may be realized with a 3D PoA device hybrid bonded on a CMOS IC, reducing the inter-module metal routing that might otherwise introduce substrate RF losses in conventional implementations. Certain aspects also provide improved thermal performance that may be achieved through shorter thermal conductive paths for RF components. Certain aspects of the present disclosure also reduce cost by reducing the overall chip size using the PoA-on-a-CMOS-device architecture, and allow for a smaller module and laminate area with improved thermal performance. Moreover, 3D PoA on CMOS (e.g., using wafer level heterogeneous integration) allows for wafer-level testing, as well as calibration of gain control for phase array antennas at a reduced cost as compared to conventional implementations.

Figure 3:
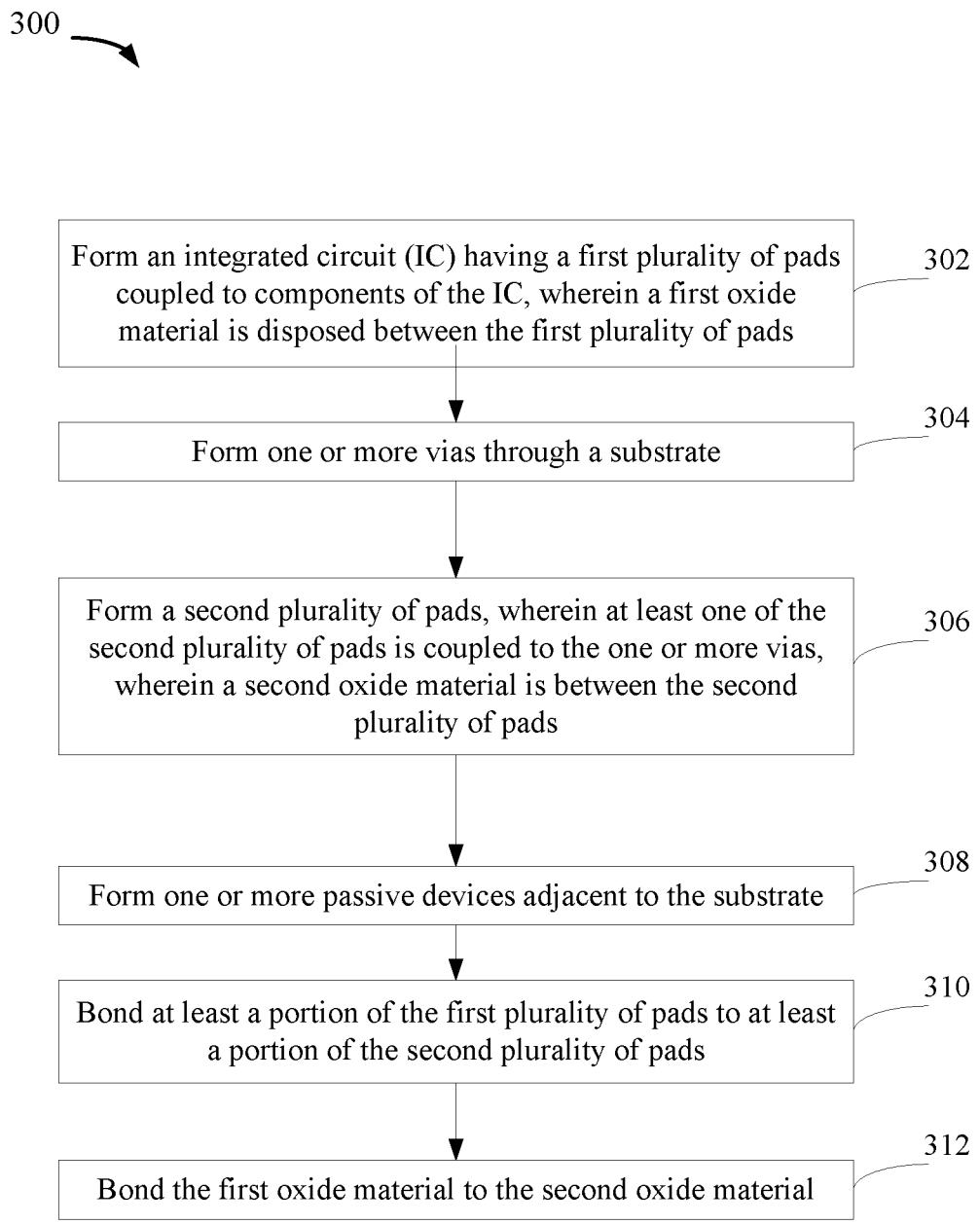
FIG. 3 is a flow diagram illustrating example operations for fabricating a semiconductor device, in accordance with certain aspects of the present disclosure.

FIG. 3 is a flow diagram illustrating example operations 300 for fabricating a semiconductor device, in accordance with certain aspects of the present disclosure. The operations 300 may be performed by a semiconductor fabrication facility.

The operations 300 begin, at block 302, with the facility forming an IC (e.g., CMOS IC 260) having a first plurality of pads (e.g., pads 206) coupled to components (e.g., CMOS transistors 204) of the IC, wherein a first oxide material is disposed between the first plurality of pads. At block 304, the facility forms one or more vias (e.g., vias 216, 218, 220, 222, 224, 226) through a substrate (e.g., substrate 220). At block 306, the facility forms a second plurality of pads (e.g., pads 207), at least one of the second plurality of pads being coupled to the one or more vias, wherein a second oxide material is disposed between the second plurality of pads. At block 308, the facility forms one or more passive devices (e.g., MIM capacitive element 230) adjacent to the substrate, at block 310, bonds at least a portion of the first plurality of pads to at least a portion of the second plurality of pads, and at block 312, bonds the first oxide material to the second oxide material.

In certain aspects, the facility also forms one or more second ICs (e.g., resonator 252) on the same layer as the substrate. For example, the substrate may be adjacent to at least three sides of the one or more second ICs. In certain aspects, the one or more second ICs may include an acoustic resonator having one or more terminals electrically coupled to one or more of the second plurality of pads.

In certain aspects, the one or more passive devices may include a 3D solenoid inductive element (e.g., inductive element 234). For example, the one or more vias may include a plurality of vias (e.g., vias 221, 222, 224, 226) that are part of the 3D solenoid inductive element. In some cases, the 3D solenoid inductor may include a magnetic core (e.g., die 250) disposed adjacent to the plurality of vias and on the same layer as the substrate.

In some aspects, the facility may also form a first MIM capacitive element (e.g., MIM capacitive element 230) above each of the one or more vias, and form a second MIM capacitive element (e.g., MIM capacitive element 240) below each of the one or more vias. In certain aspects, the one or more passive devices may include a MIM capacitive element, a 2D inductive element, a 3D inductive element, acoustic resonator, or any combination thereof.

The various illustrative circuits described in connection with aspects described herein may be implemented in or with an integrated circuit (IC), such as a processor, a digital signal processor (DSP), an application-specific integrated circuit (ASIC), a field-programmable gate array (FPGA), or other programmable logic device. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is also noted that the operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A semiconductor device comprising:
    an integrated circuit (IC) having a first plurality of pads coupled to components of the IC, wherein a first oxide material is disposed between the first plurality of pads;
    a second plurality of pads, wherein at least a portion of the first plurality of pads is bonded to at least a portion of the second plurality of pads, and wherein a second oxide material is disposed between the second plurality of pads, the first oxide material being bonded to the second oxide material;
    a substrate disposed above the second plurality of pads;
    one or more passive devices disposed adjacent to the substrate;
    one or more vias formed through the substrate, wherein:
        at least one of the second plurality of pads is coupled to the one or more vias;
        the one or more passive devices comprise a three-dimensional (3D) solenoid inductive element;
        the one or more vias comprise a plurality of vias that are part of the 3D solenoid inductive element; and
        the 3D solenoid inductive element comprises a magnetic core disposed adjacent to the plurality of vias and at least partially embedded in the substrate;
    a first metal-insulator-metal (MIM) capacitor disposed above the substrate;
    a second MIM capacitor disposed below the substrate and coupled to the first MIM capacitor through at least one of the one or more vias; and
    an acoustic resonator at least partially embedded in the substrate and having one or more terminals electrically coupled to one or more of the second plurality of pads.

2. The semiconductor device of claim 1, further comprising one or more second ICs at least partially embedded in the substrate.

3. The semiconductor device of claim 2, wherein the substrate is adjacent to at least three sides of the one or more second ICs.

4. The semiconductor device of claim 1, wherein the substrate comprises alumina and wherein the one or more vias comprise through-alumina vias (TAVs).

5. The semiconductor device of claim 1, wherein the one or more passive devices further comprise at least one of:
   a metal-insulator-metal (MIM) capacitive element;
   a two-dimensional (2D) inductive element; or
   another acoustic resonator.

6. The semiconductor device of claim 1, wherein the first plurality of pads and the second plurality of pads comprise copper pads.

7. The semiconductor device of claim 1, wherein the components of the IC comprise complementary metal-oxide-semiconductor (CMOS) components.

8. The semiconductor device of claim 1, wherein a terminal of the one or more terminals of the acoustic resonator is coupled to the 3D solenoid inductive element via an interconnect.

9. The semiconductor device of claim 1, wherein a die is embedded in a recess cavity of the substrate and wherein the die is implemented as the magnetic core for the 3D solenoid inductive element.

10. The semiconductor device of claim 8, wherein the interconnect is disposed under at least a portion of the acoustic resonator.

11. The semiconductor device of claim 1, wherein the first MIM capacitor and the second MIM capacitor are symmetric with respect to a longitudinal axis through the substrate.

12. The semiconductor device of claim 1, wherein one or more lateral surfaces of the first MIM capacitor are aligned with one or more lateral surfaces of the second MIM capacitor.

13. The semiconductor device of claim 1, wherein two opposing lateral surfaces of the first MIM capacitor are aligned with two opposing lateral surfaces of the second MIM capacitor.

14. The semiconductor device of claim 1, wherein the first MIM capacitor and the second MIM capacitor have the same dimensions, including a height and a planar surface area.

15. A method for fabricating a semiconductor device, comprising:
   forming an integrated circuit (IC) having a first plurality of pads coupled to components of the IC, wherein a first oxide material is disposed between the first plurality of pads;
   forming one or more vias through a substrate;
   forming a second plurality of pads, wherein at least one of the second plurality of pads is coupled to the one or more vias and wherein a second oxide material is disposed between the second plurality of pads;
   forming one or more passive devices adjacent to the substrate, wherein:
      the one or more passive devices comprise a three-dimensional (3D) solenoid inductive element;
      the one or more vias comprise a plurality of vias that are part of the 3D solenoid inductive element; and
      the 3D solenoid inductive element comprises a magnetic core disposed adjacent to the plurality of vias and at least partially embedded in the substrate;
   forming a first metal-insulator-metal (MIM) capacitor above the substrate;
   forming a second MIM capacitor below the substrate, wherein the second MIM capacitor is coupled to the first MIM capacitor through at least one of the one or more vias;
   forming an acoustic resonator at least partially embedded in the substrate, wherein the acoustic resonator has one or more terminals electrically coupled to one or more of the second plurality of pads;
   bonding at least a portion of the first plurality of pads to at least a portion of the second plurality of pads; and
   bonding the first oxide material to the second oxide material.

16. The method of claim 15, further comprising forming one or more second ICs at least partially embedded in the substrate, wherein the substrate is adjacent to at least three sides of one of the second ICs.

17. The method of claim 15, wherein a terminal of the one or more terminals of the acoustic resonator is coupled to the 3D solenoid inductive element via an interconnect.

18. The method of claim 15, wherein a die is embedded in a recess cavity of the substrate and wherein the die is implemented as the magnetic core for the 3D solenoid inductive element.

19. The method of claim 17, wherein the interconnect is disposed under at least a portion of the acoustic resonator.

20. The method of claim 15, wherein the first MIM capacitor and the second MIM capacitor are symmetric with respect to a longitudinal axis through the substrate.

* * * * *